United States Patent [19]
Shigehara et al.

[11] Patent Number: 6,054,736
[45] Date of Patent: Apr. 25, 2000

[54] SEMICONDUCTOR DEVICE

[75] Inventors: Hiroshi Shigehara, Machida; Masanori Kinugasa, Yokohama; Akira Takiba, Kawasaki; Ryouichi Isohata, Oita, all of Japan

[73] Assignee: Kabushiki Kaisha Toshiba, Kawasaki, Japan

[21] Appl. No.: 09/076,874

[22] Filed: May 13, 1998

[30] Foreign Application Priority Data

May 15, 1997 [JP] Japan ................................ 9-125904

[51] Int. Cl.[7] .......................... H01L 29/68; H01L 21/265
[52] U.S. Cl. .......................... 257/336; 257/339; 257/363; 257/409
[58] Field of Search .................... 257/340, 336, 257/350, 409, 363, 408, 536, 580, 360, 594, 339

[56] References Cited

U.S. PATENT DOCUMENTS

| | | | |
|---|---|---|---|
| 5,440,162 | 8/1995 | Worley et al. | 257/335 |
| 5,498,892 | 3/1996 | Walker et al. | 257/336 |
| 5,763,919 | 6/1998 | Lin | 257/360 |
| 5,804,864 | 9/1998 | Akiyama | 257/408 |
| 5,831,312 | 11/1998 | Wen | 257/360 |

*Primary Examiner*—Donald L. Monin, Jr.
*Attorney, Agent, or Firm*—Foley & Lardner

[57] ABSTRACT

A semiconductor device of the present invention comprises: a semiconductor substrate of a first conductive type; a gate electrode formed on the semiconductor substrate; a first semiconductor region of a second conductive type different from the first conductive type, the first semiconductor region being formed on the semiconductor substrate in one of both side regions of the gate electrode so as to be adjacent to the gate electrode; a second semiconductor region of the second conductive type formed on the semiconductor substrate in the other region of the both side regions of the gate electrode so as to be adjacent to the gate electrode; a third semiconductor region of the second conductive type formed in the one region so as to be isolated from the first semiconductor region and to be spaced from the second semiconductor region by a greater distance than that between the first and third semiconductor regions; a connecting portion for connecting the first semiconductor region to the third semiconductor region, the connecting portion having a higher resistance than those of the first and third semiconductor regions; a first electrode formed so as to be electrically connected to the third semiconductor region; and a second electrode formed so as to be electrically connected to the second semiconductor region. Thus, it is possible to prevent the element characteristics from deteriorating even if a surge voltage is applied and to decrease the element size.

20 Claims, 15 Drawing Sheets

A-A CROSS SECTION

A—A CROSS SECTION

A-A CROSS SECTION

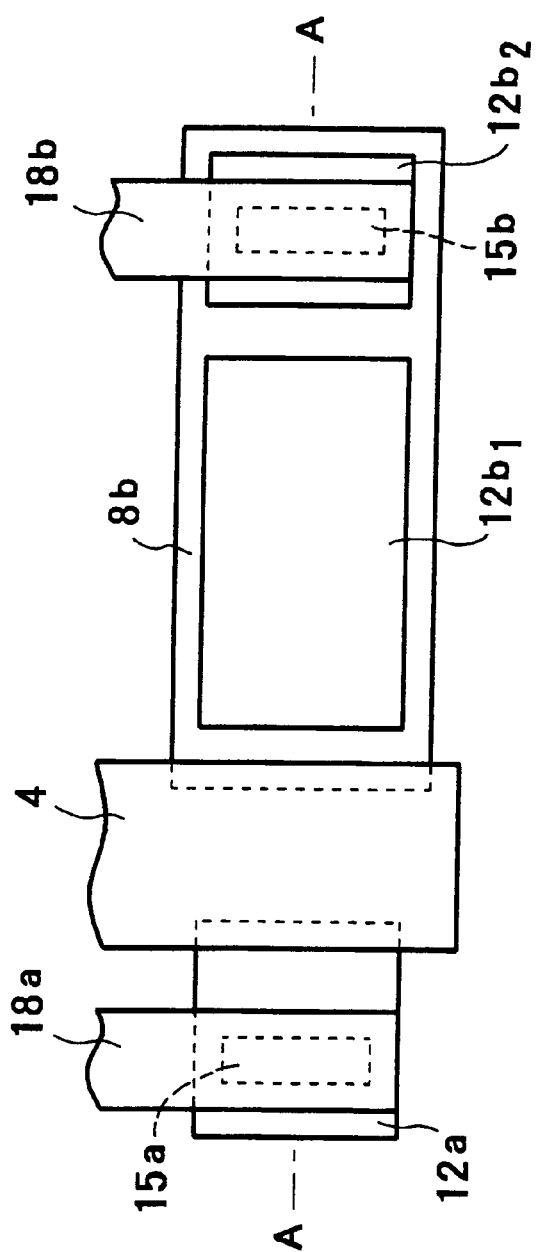
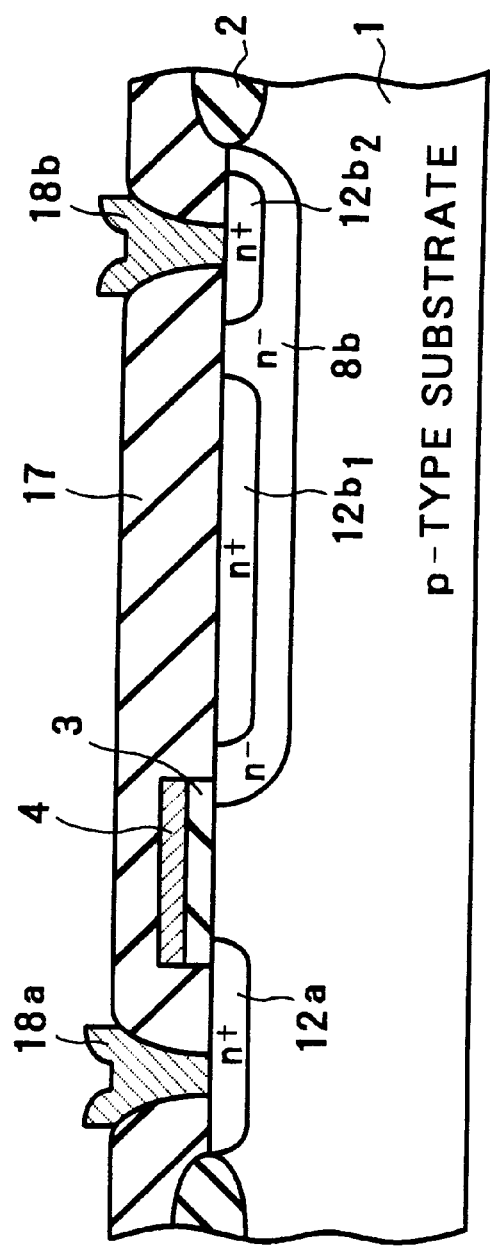
FIG. 4A
FIG. 4B  A—A CROSS SECTION

A–A CROSS SECTION

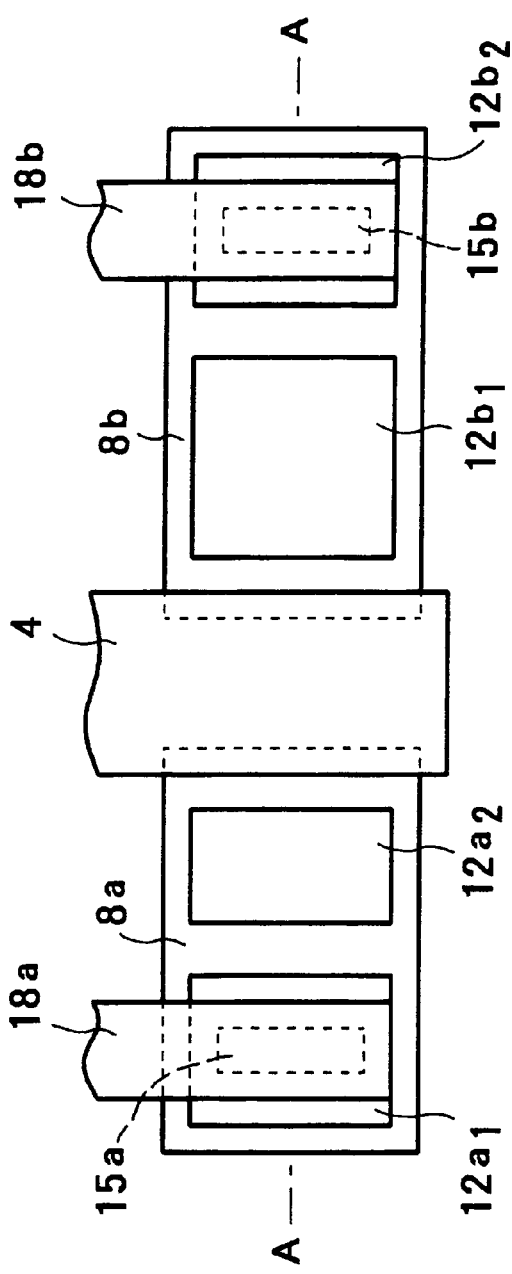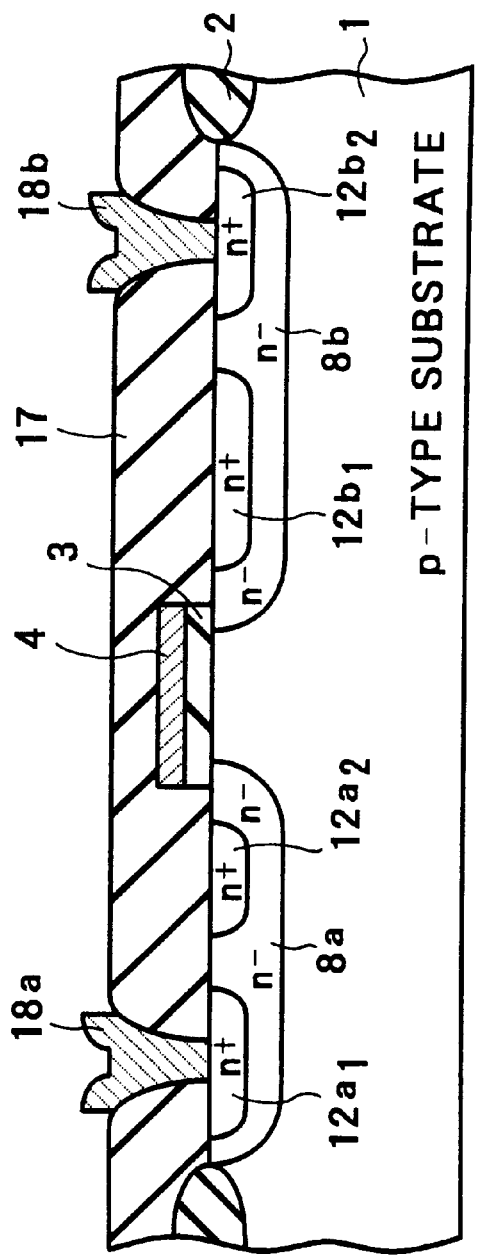

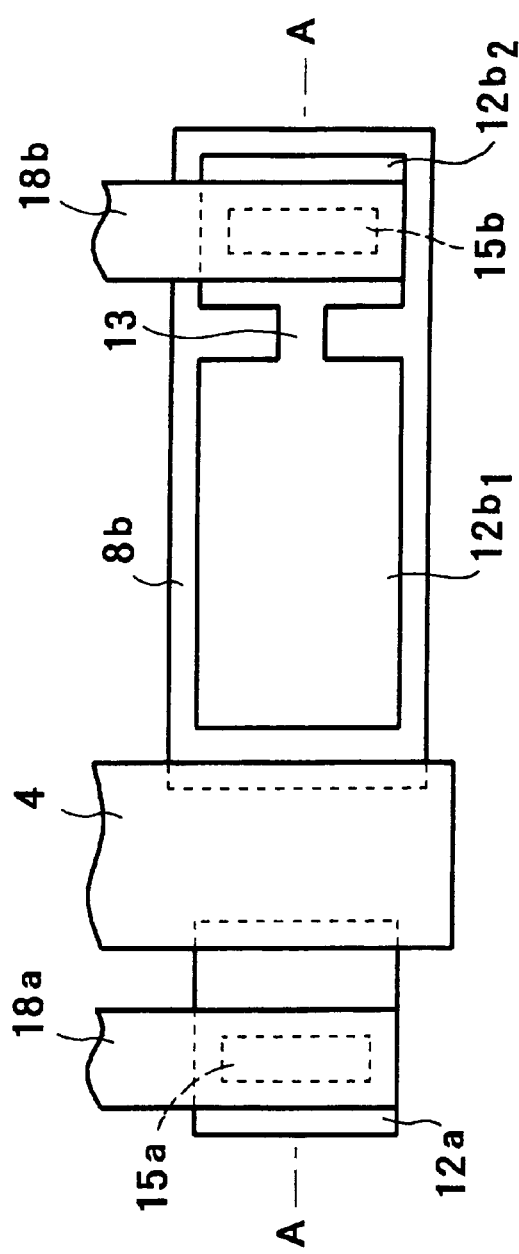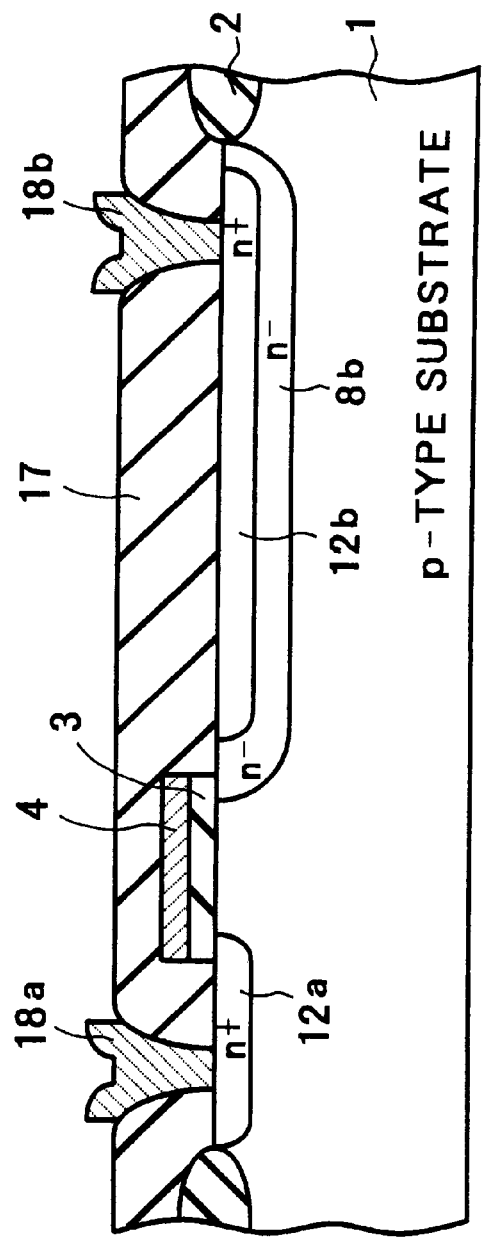
FIG. 9A
FIG. 9B  A—A CROSS SECTION

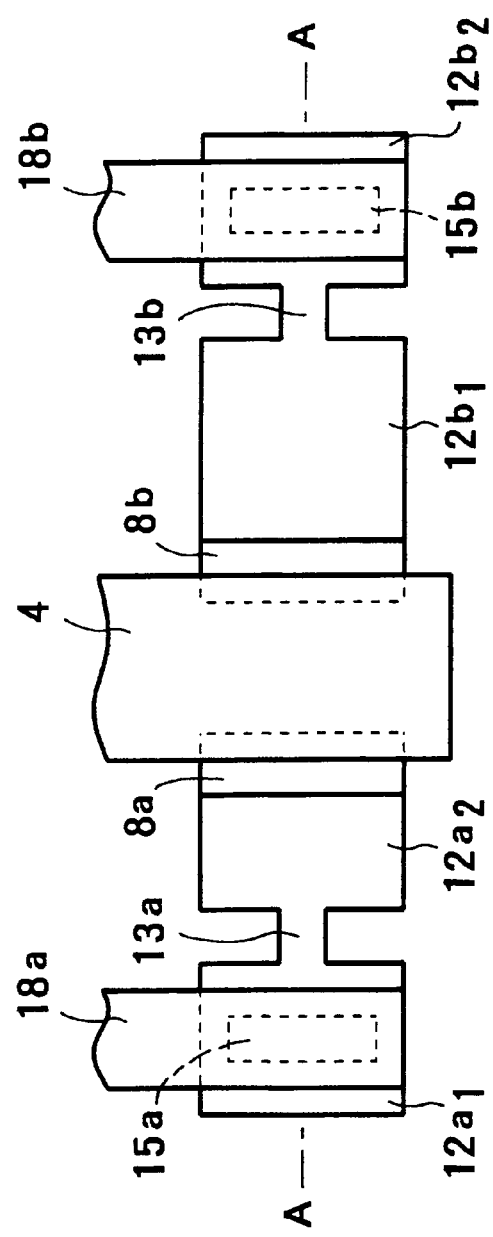
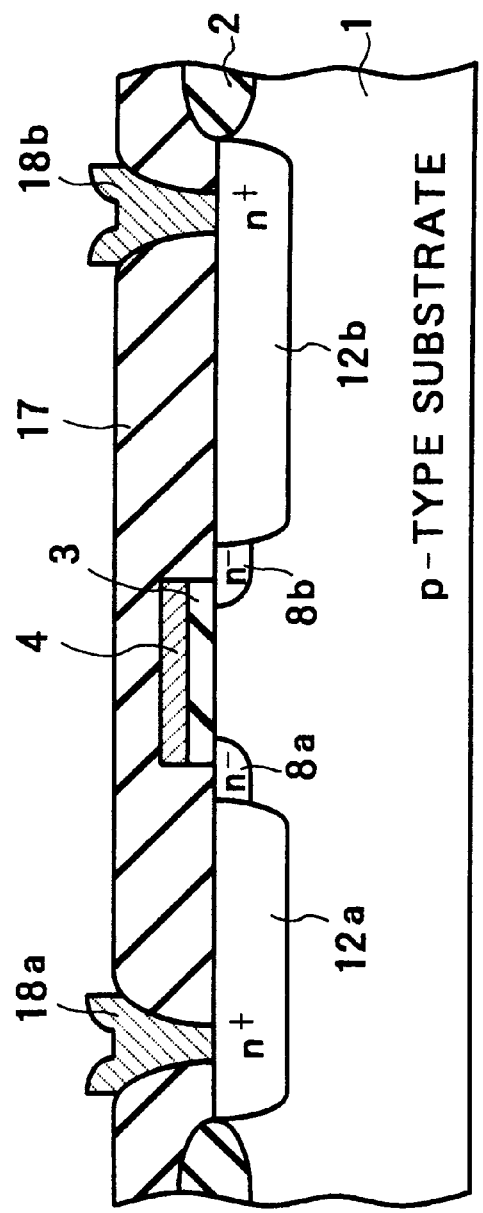
FIG.10A
FIG.10B
A–A CROSS SECTION

FIG.11B A-A CROSS SECTION

A—A CROSS SECTION

A-A CROSS SECTION

A—A CROSS SECTION

A—A CROSS SECTION

SEMICONDUCTOR DEVICE

BACKGROUND OF THE INVENTION

1. Field of the Invention

The present invention relates generally to a semiconductor device.

2. Description of Background Art

FIG. 12A is a plan view of a conventional semiconductor device having an nMOS transistor, and FIG. 12B is a sectional view taken along line A—A of FIG. 12A. This nMOS transistor has a LDD structure and is formed in an element region of a p-type substrate 1. This element region is insulated and isolated from other elements by an element isolating insulator film 2 which is formed on the p-type substrate 1 by, e.g., the LOCOS method. A gate electrode 4 is formed on the element region via a gate insulator film 3.

On both sides of the gate electrode 4, high-density $n^+$-diffusion layer regions 12a, 12b serving as source and drain regions are formed. Between the $n^+$-diffusion layer regions 12a, 12b and a region serving as a channel arranged directly below the gate electrode 4, low-density $n^-$-diffusion layer regions 8a, 8b are formed. The low-density and high-density diffusion layer regions and the gate electrode 4 are covered with an interlayer insulator film 17. The interlayer insulator film 17 has contact holes for providing contacts 15a, 15b to the source and drain regions 12a, 12b. Source and drain electrodes 18a, 18b are formed so as to fill in the contact holes.

FIG. 13A is a plan view of another conventional semiconductor device having an nMOS transistor, and FIG. 13B is a sectional view taken along line A—A of FIG. 13A. The nMOS transistor shown in FIGS. 13A and 13B has the same construction as that of the nMOS transistor shown in FIGS. 12A and 12B, except that high-density $n^+$-diffusion layer regions 12a and 12b are surrounded by low-density $n^-$-diffusion layer regions 8a and 8b, respectively.

In such a conventional n-MOS transistor, when a surge voltage is applied to a drain electrode 18b while a source electrode 18a and a p-type substrate 1 are connected to a ground power supply, a current flows through the channel portion of the MOS transistor due to the punch through or the like, and an npn-type parasitic bipolar transistor comprising the drain region 12b, the p-type substrate 1 and the source region 12a is turned ON, so that a current flows through the parasitic bipolar transistor into the earthed power source. The current flowing by causing the parasitic bipolar transistor to be turned ON causes the avalanche breakdown phenomenon, so that a very high current flows at a stroke. This is not desired since the p-n junction between the drain-side diffusion layer region 8b or 12b and the p-type substrate 1 may be thermally broken.

In order to eliminate such a disadvantage, for example, a method for arranging a current limiting resistor 20 between a surge-voltage applied point 25 and a drain electrode 18b is used as shown in FIG. 14. The resistor 20 is made of, e.g., a polysilicon or a diffusion layer. When the resistor of the polysilicon is used, the width of the resistor must be a sufficient to prevent the resistor from being burned out by the surge current. When the resistor of the diffusion layer is used, the surge voltage is easy to cause the breakdown of the p-n junction, so that the function as a resistor may be deteriorated. Moreover, in order to prevent the function as a resistor from being deteriorated by the avalanche breakdown between a diffusion resistor (particularly a portion, to which the surge voltage is first applied) and the source of the transistor, the diffusion resistor must be isolated sufficiently from the transistor. Therefore, it is required to provide a wide area on the surface of the semiconductor substrate. That is, either case is not desired since it is required to provide a wide area for an element for coping with the ESD (Electro Static Discharge).

In place of the method for using the current limiting resistor 20, there is a method for controlling to decrease the current amplification factor of an npn-type parasitic bipolar transistor causing the avalanche breakdown so that the current value does not cause the thermal breakdown. In this method, as shown in FIGS. 15A and 15B or 16A and 16b, a source-region contact 15a is spaced from a drain-region contact 15b at a predetermined distance to decrease the current amplification factor. This is based on a model wherein a surge voltage is transmitted from a drain electrode 18b to a drain region 12b via the contact 15b to pass through the drain region 12b to a p-type substrate 1 arranged directly below the contact 15b to cause the avalanche breakdown. Furthermore, the distance between the contact 15a and the contact 15b of the n-MOS transistor shown in FIGS. 15A, 15b or 16A, 16B is greater than that of the n-MOS transistor shown in FIGS. 12A, 12B or 13A, 13B.

Thus, the surge voltage passes to the p-type substrate 1 arranged directly below the contact 15b to cause the avalanche breakdown. However, in the conventional nMOS transistor, since the sheet resistance of the $n^+$-diffusion layer region 12b is low, e.g., about 25 $\Omega$, the surge voltage passes to the substrate 1 even at a portion closer to the gate electrode 4 of the $n^+$-diffusion layer region 12b to cause the avalanche breakdown. Thus, even in the nMOS transistor having the structure shown in FIGS. 15A and 15B or 16A and 16B, the distance between the contacts must be sufficiently great to prevent the thermal breakdown from occurring. That is, the actual distance between the contacts must be greater than the distance between the contact, which is determined on the basis of the model wherein the surge voltage passes to the p-type substrate 1 arranged directly below the contact 15b to cause the avalanche breakdown. Therefore, the size of the transistor element for coping with the ESD is increased, and this is not desired.

SUMMARY OF THE INVENTION

It is therefore an object of the present invention to eliminate the aforementioned problems and to provide a semiconductor device having a MOS transistor, which can prevent the element characteristics from deteriorating even if a surge voltage is applied thereto and which has a smaller size.

In order to accomplish the aforementioned and other objects, according to one aspect of the present invention, a semiconductor device comprises: a semiconductor substrate of a first conductive type; a gate electrode formed on the semiconductor substrate; a first semiconductor region of a second conductive type, which is different from the first conductive type, the first semiconductor region being formed on the semiconductor substrate in one of both side regions of the gate electrode so as to be adjacent to the gate electrode; a second semiconductor region of the second conductive type formed on the semiconductor substrate in the other region of the both side regions of the gate electrode so as to be adjacent to the gate electrode; a third semiconductor region of the second conductive type formed in the one region so as to be isolated from the first semiconductor region and to be spaced from the second semiconductor region by a greater distance than that between the first and third semiconductor regions; a connecting portion for connecting the first semiconductor region to the third semiconductor region, the connecting portion having a higher resistance than those of the first and third semiconductor regions; a first electrode formed so as to be electrically connected to the third semiconductor region; and a second electrode formed so as to be electrically connected to the second semiconductor region.

The connecting portion may be made of a diffusion layer region, which has the second conductive type and substantially the same impurity concentration as those of the first and third semiconductor regions, the connecting portion having a smaller width than those of the first and third semiconductor regions. The first and third semiconductor regions and the connecting portion may be surrounded by a diffusion layer region of the second conductive type, which is formed on the semiconductor substrate and which has a lower concentration than those of the first and third semiconductor regions.

The semiconductor device may further comprise a diffusion layer region of the second conductive type which is formed between a region of the semiconductor substrate serving as a channel arranged directly below the gate electrode and the first semiconductor region and which has a lower impurity concentration than those of the first and third semiconductor regions.

The connecting portion may be a diffusion layer region of the second conductive type having a lower impurity concentration than those of the first and third semiconductor regions. The connecting portion may have substantially the same impurity concentration as that of the diffusion layer region of the second conductive type formed between the channel and the first semiconductor region. The diffusion layer region forming the connecting portion may surround the first and third semiconductor regions. The connecting portion may be formed adjacent to the first electrode between the gate electrode and the first electrode.

According to another aspect of the present invention, a semiconductor device comprises: a semiconductor substrate of a first conductive type; a gate electrode formed on the semiconductor substrate; a first drain region of a second conductive type, which is different from the first conductive type, the first drain region being formed on the semiconductor substrate in one of both side regions of the gate electrode so as to be adjacent to the gate electrode; a first source region of the second conductive type formed on the semiconductor substrate in the other region of the both side regions of the gate electrode so as to be adjacent to the gate electrode; a second drain region of the second conductive type formed in the one region so as to be isolated from the first drain region and to be spaced from the first source region by a greater distance than that between the first and second drain regions; a second source region of the second conductive type formed in the other region so as to be isolated from the first source region and to be spaced from the first drain region by a greater distance than that between the first and second source regions; a first connecting portion for connecting the first drain region to the second drain region, the connecting portion having a higher resistance than those of the first and second drain regions; a second connecting portion for connecting the first source region to the second source region, the connecting portion having a higher resistance than those of the first and second source regions; a drain electrode formed so as to be electrically connected to the second drain region; and a source electrode formed so as to be electrically connected to the second source region.

The first connecting portion may be made of a diffusion layer region, which has the second conductive type and substantially the same impurity concentration as those of the first and second drain regions, the first connecting portion having a smaller width than those of the first and second drain regions, and the second connecting portion may be made of a diffusion layer region, which has the second conductive type and substantially the same impurity concentration as those of the first and second source regions, the second connecting portion having smaller width than those of the first and second source regions.

The semiconductor device may further comprise a diffusion layer region of the second conductive type which is formed between a region of the semiconductor substrate serving as a channel arranged directly below the gate electrode and the first drain region and which has a lower impurity concentration than those of the first and second drain regions, and a diffusion layer region of the second conductive type which is formed between the channel and the first source region and which has a lower impurity concentration than those of the first and second source regions.

The first connecting portion may be a diffusion layer region of the second conductive type having a lower impurity concentration than those of the first and second drain regions, and the second connecting portion may be a diffusion layer region of the second conductive type having a lower impurity concentration than those of the first and second source regions.

The first connecting portion may have substantially the same impurity concentration as that of the diffusion layer region of the second conductive type formed between the channel and the first drain region, and the second connecting portion may have substantially the same impurity concentration as that of the diffusion layer region of the second conductive type formed between the channel and the first source region.

The diffusion layer region forming the first connecting portion may surround the first and second drain regions. The diffusion layer region forming the second connecting portion may surround the first and second source regions. The first connecting portion may be formed adjacent to the drain electrode between the gate electrode and the drain electrode, and the second connecting portion may be formed adjacent to the source electrode between the gate electrode and the source electrode.

The semiconductor device may further comprise a diffusion layer region of the second conductive type which is formed between the first drain region and a region of the semiconductor substrate serving as a channel arranged directly below the gate electrode and which has a lower impurity concentration than those of the first and second drain regions, and a diffusion layer region of the second conductive type which is formed between the channel and the first source region and which has a lower impurity concentration than those of the first and second source regions.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 4A is a plan view of the fourth preferred embodiment of a semiconductor device according to the present invention;

FIG. 4B is a sectional view taken along line A—A of FIG. 4A;

FIG. 7A is a plan view of the seventh preferred embodiment of a semiconductor device according to the present invention;

FIG. 7B is a sectional view taken along line A—A of FIG. 7A;

FIG. 9A is a plan view of the ninth preferred embodiment of a semiconductor device according to the present invention;

FIG. 9B is a sectional view taken along line A—A of FIG. 9A;

FIG. 10A is a plan view of the tenth preferred embodiment of a semiconductor device according to the present invention;

FIG. 10B is a sectional view taken along line A—A of FIG. 10A;

FIG. 11B is a sectional view taken along line A—A of FIG. 11A;

DESCRIPTION OF THE PREFERRED EMBODIMENTS

Figure 1A:
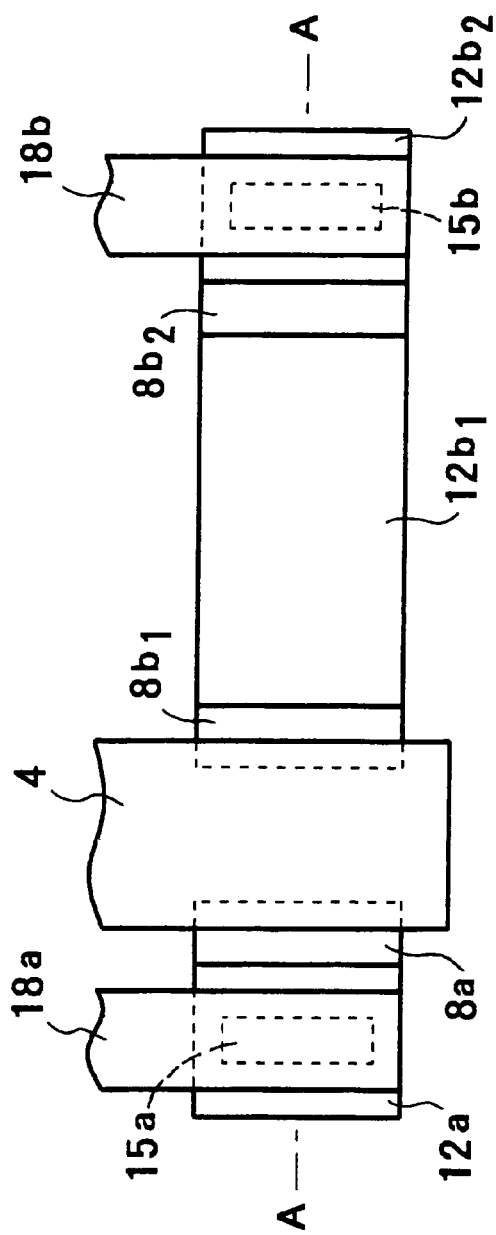
FIG. 1A is a plan view of the first preferred embodiment of a semiconductor device according to the present invention.
Figure 1B:
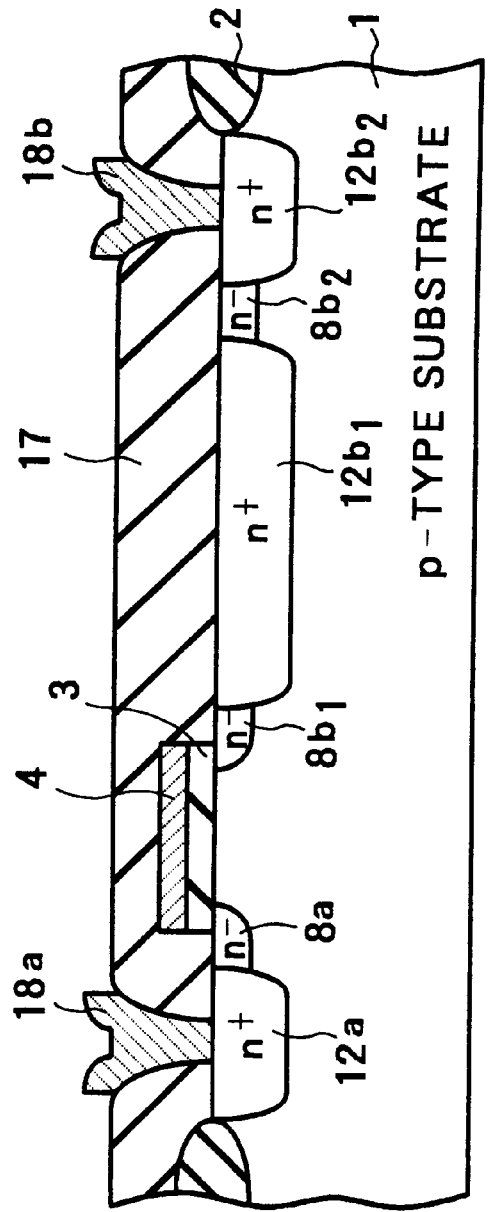
FIG. 1B is a sectional view taken along line A—A of FIG. 1A.

Referring now to the accompanying drawings, particularly to FIGS. 1A and 1B, the first preferred embodiment of a semiconductor device according to the present invention will be described below. FIG. 1A is a plan view of the first preferred embodiment of a semiconductor device according to the present invention, and FIG. 1B is a sectional view taken along line A—A of FIG. 1A.

The semiconductor device in this first preferred embodiment has an nMOS transistor having a LDD structure. The nMOS transistor is formed in an element region of a p-type substrate 1. This element region is insulated and isolated from other elements by an element isolating insulator film 2 formed on the p-type substrate 1. On the element region, a gate electrode 4 is formed via a gate insulator film 3.

In a region of the p-type substrate 1 on one side of the gate electrode 4, an $n^+$-diffusion layer region $12a$ serving as a source region is formed so as to be spaced from a region serving as a channel arranged directly below the gate electrode 4. In a region of the p-type substrate 1 between the source region $12a$ and the region serving as the channel, an $n^-$-diffusion layer region $8a$ having a lower concentration than that of the $n^+$-diffusion layer $12a$ is provided. For example, the concentration of the $n^-$-diffusion layer region $8a$ is set so that the value of sheet resistance of the $n^-$-diffusion layer region $8a$ is about 1 k$\Omega$ if the value of sheet resistance of the $n^+$-diffusion layer region $12a$ is about 25 $\Omega$.

In a region of the p-type substrate 1 on the other side of the gate electrode 4, high-density $n^+$-diffusion layer regions $12b_1$ and $12b_2$ serving as drain regions are formed so as to be spaced from each other. In a region of the p-type substrate 1 between the region serving as the channel and the $n^+$-diffusion layer region $12b_1$, a low-density $n^-$-diffusion layer region $8b_1$ connected to the $n^+$-diffusion layer region $12b_1$ is formed. In a region of the p-type substrate 1 between the $n^+$-diffusion layer region $12b_1$ and the $n^+$-diffusion layer region $12b_2$, a low-density $n^-$-diffusion layer region $8b_2$ connected to the $n^+$-diffusion layer regions $12b_1$ and $12b_2$ is formed. This $n^-$-diffusion layer region $8b_2$ is preferably arranged near a contact $15b$.

These diffusion layer regions and the gate electrode 4 are covered with an interlayer insulator film 17. The interlayer insulator film 17 has contact holes for providing contacts $15a$ and $15b$ to the source and drain regions $12a$ and $12b_2$. A source electrode $18a$ and a drain electrode $18b$ are formed so as to fill in the contact holes.

According to this preferred embodiment of the semiconductor device having the above construction, the $n^+$-diffusion layer regions $12b_1$ and $12b_2$ serving as drain regions are separated from each other by the $n^-$-diffusion layer region $8b_2$ having a higher sheet resistance than those of the $n^+$-diffusion layer regions $12b_1$ and $12b_2$, and the n⁻-diffusion layer region $8b_2$ is disposed near the contact $15b$. Therefore, even if a surge voltage is applied to the drain electrode $18b$, the surge voltage passes through the contact $15b$ and the n⁺-diffusion layer region $12b_2$ in a vertical direction to the p-type substrate 1 to cause the avalanche breakdown. However, the surge voltage is difficult to be transmitted in horizontal directions since the high-resistance n⁻-diffusion layer region $8b_2$ is provided, so that it is difficult to cause the avalanche breakdown since the n⁻-diffusion layer region $8b_2$ functions as a current limiting resistor even if the surge voltage is transmitted to the n⁺-diffusion layer region $12b_1$ via the n⁻-diffusion layer region $8b_2$.

Therefore, even if the contacts $15a$ and $15b$ are arranged so that the actual distance between the contacts $15a$ and $15b$ is equal to the distance determined on the basis of the model wherein the surge voltage passes to the p-type substrate 1 arranged directly below the contact $15b$ to cause the avalanche breakdown, the elements are not broken. Thus, the element size can be decreased in comparison with conventional elements.

Figure 2A:
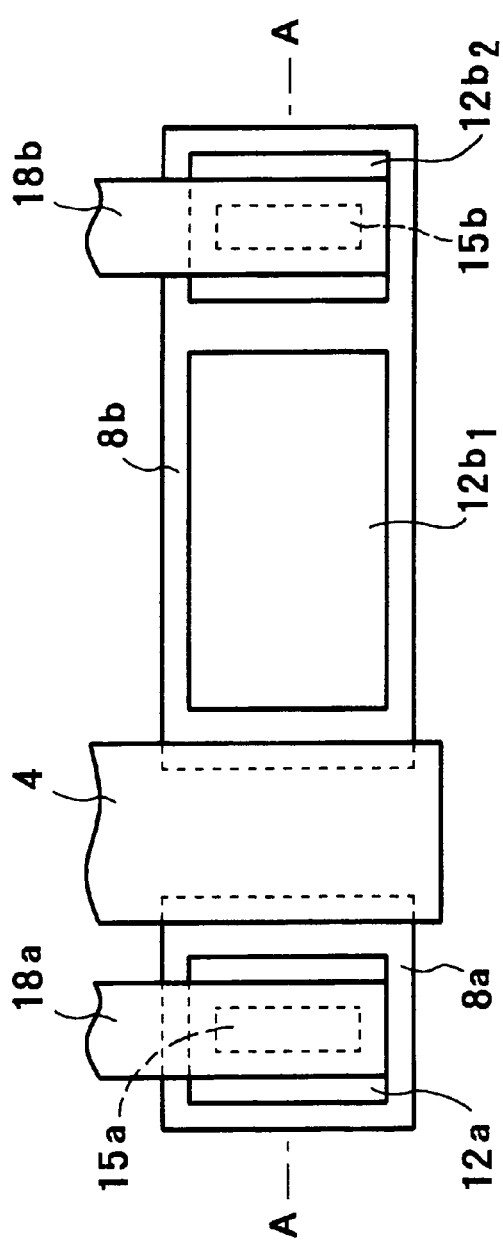
FIG. 2A is a plan view of the second preferred embodiment of a semiconductor device according to the present invention.
Figure 2B:
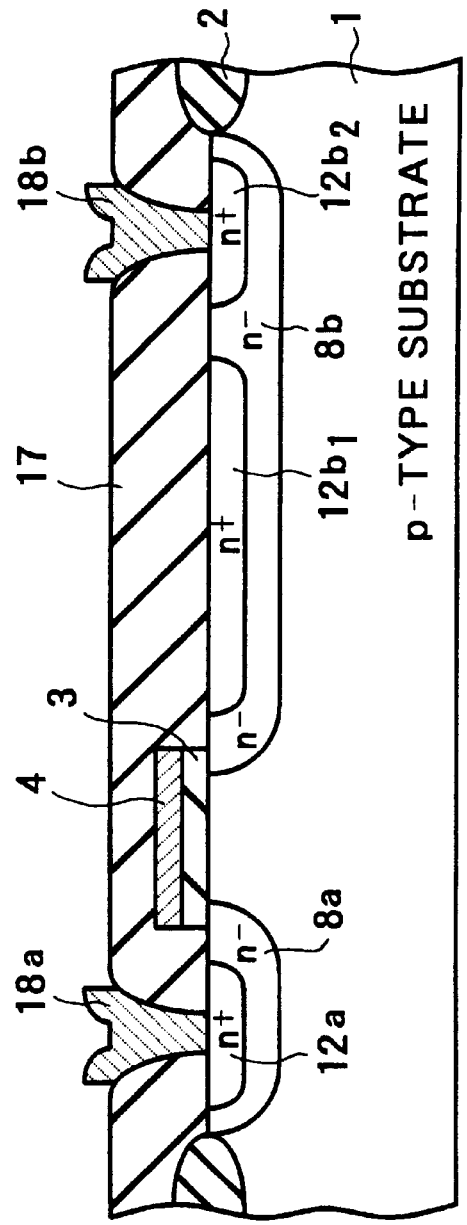
FIG. 2B is a sectional view taken along line A—A of FIG. 2A.

Referring to FIGS. 2A and 2B, the second preferred embodiment of a semiconductor device according to the present invention will be described below. FIG. 2A is a plan view of the second preferred embodiment of a semiconductor device according to the present invention, and FIG. 2B is a sectional view taken along line A—A of FIG. 2A.

In this second preferred embodiment of the semiconductor device, a common drain-side n⁻-diffusion layer region $8b$ is formed so as to surround n⁺-diffusion layer regions $12b_1$ and $12b_2$ in place of the drain-side n⁻-diffusion layer regions $8b_1$ and $8b_2$ in the first preferred embodiment of the semiconductor device shown in FIGS. 1A and 1B, and a source-side n⁻-diffusion layer region $8a$ is formed so as to surround an n⁺-diffusion layer region $12a$.

Also in this second preferred embodiment, since the high-resistance n⁻-diffusion layer region $8b$ is formed so as to isolate the n⁺-diffusion layer regions $12b_1$ and $12b_2$ serving as drain regions from each other and to be disposed near the drain-side contact $15b$, the same advantages as those in the first preferred embodiment can be obtained.

Figure 3A:
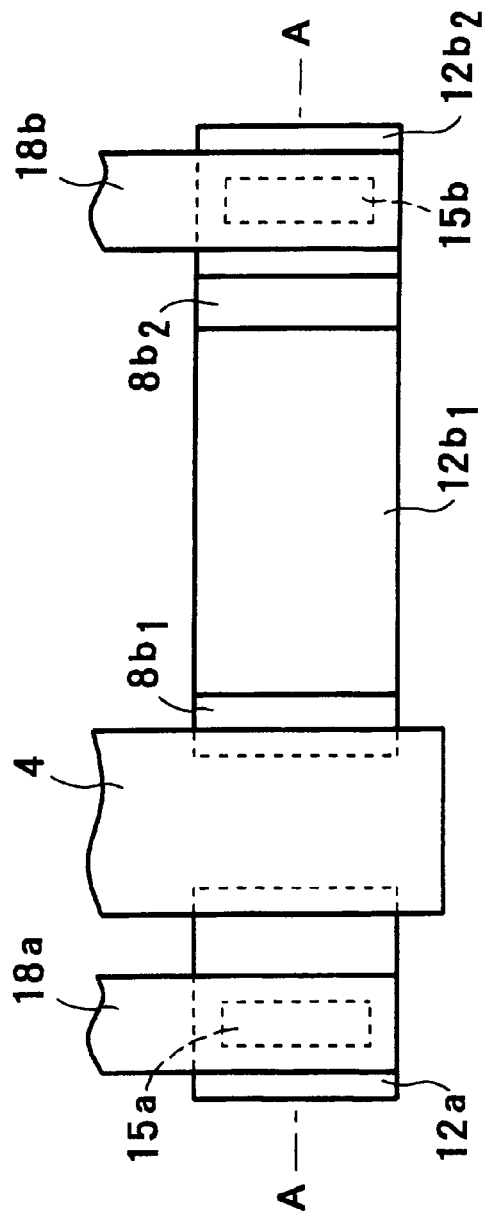
FIG. 3A is a plan view of the third preferred embodiment of a semiconductor device according to the present invention.
Figure 3B:
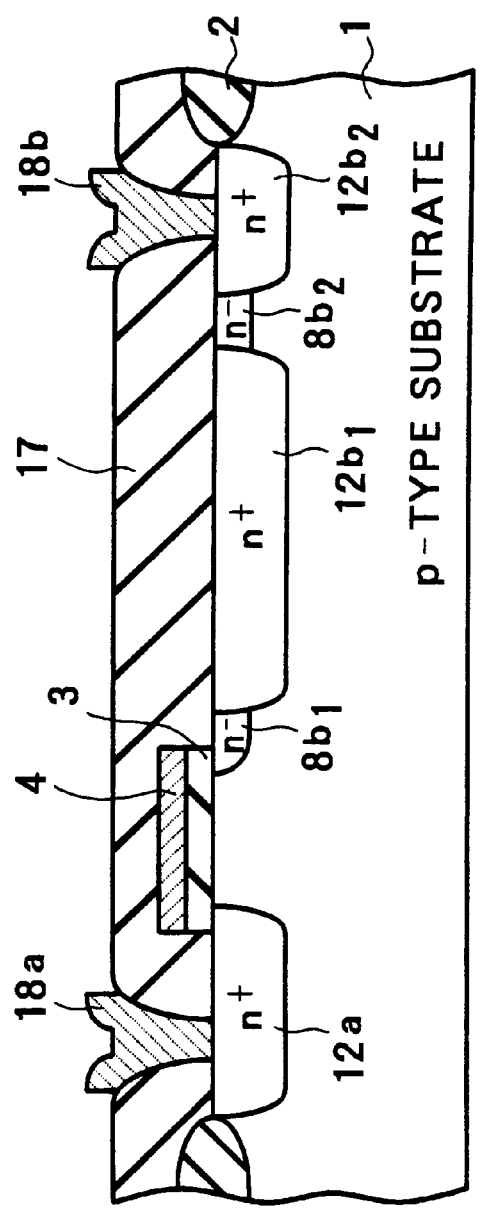
FIG. 3B is a sectional view taken along line A—A of FIG. 3A.

Referring to FIGS. 3A and 3B, the third preferred embodiment of a semiconductor device according to the present invention will be described below. FIG. 3A is a plan view of the third preferred embodiment of a semiconductor device according to the present invention, and FIG. 3B is a sectional view taken along line A—A of FIG. 3A.

The semiconductor device in this third preferred embodiment has the same construction as that in the first preferred embodiment shown in FIGS. 1A and 1B, except that the source-side n⁻-diffusion layer region Ba in the first preferred embodiment is not provided. Since the drain-side structure of the semiconductor device in the third preferred embodiment is the same as that in the first preferred embodiment, the semiconductor device in the third preferred embodiment has the same advantages as those in the first preferred embodiment.

Referring to FIGS. 4A and 4B, the fourth preferred embodiment of a semiconductor device according to the present invention will be described below. FIG. 4A is a plan view of the fourth preferred embodiment of a semiconductor device according to the present invention, and FIG. 4B is a sectional view taken along line A—A of FIG. 4B.

The semiconductor device in this fourth preferred embodiment has the same construction as that in the second preferred embodiment shown in FIGS. 2A and 2B, except that the source-side n⁻-diffusion layer region $8a$ in the second preferred embodiment is not provided. Since the drain-side structure of the semiconductor device in the fourth preferred embodiment is the same as that in the second preferred embodiment, the semiconductor device in the fourth preferred embodiment has the same advantages as those in the second preferred embodiment.

As the fifth preferred embodiment of a process for producing a semiconductor device according to the present invention, a process for producing the fourth preferred embodiment of a semiconductor device according to the present invention will be described below.

FIGS. 5A through 5D are sectional views showing the fifth preferred embodiment of a process for producing a semiconductor device according to the present invention. First, an element isolating insulator film 2 is formed on a p-type substrate 1 by, e.g., the LOCOS method, to perform the element isolation (see FIG. 5A). Subsequently, a gate insulator film 3 and a film of a gate electrode material, e.g., a polysilicon, are deposited on the whole surface of the substrate, and then, an gate electrode 4 is formed in an element region by the patterning (see FIG. 5A).

Figure 5A:
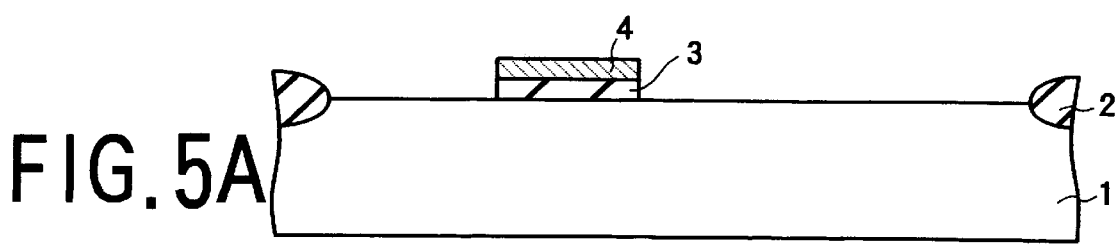
FIGS. 5A through 5D are sectional views showing the fifth preferred embodiment of a process for producing a semiconductor device according to the present invention.
Figure 5B:
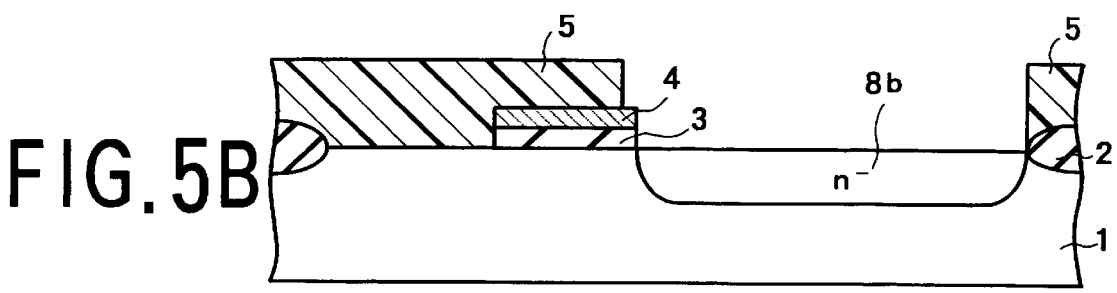

Then, as shown in FIG. 5B, a resist pattern 5 of a photoresist having an opening in a region, in which a drain is intended to be formed, is formed, and an n⁻-diffusion layer region $8b$ is formed by ion-implanting an impurity using the resist pattern 5 as a mask (see FIG. 5B).

Figure 5C:
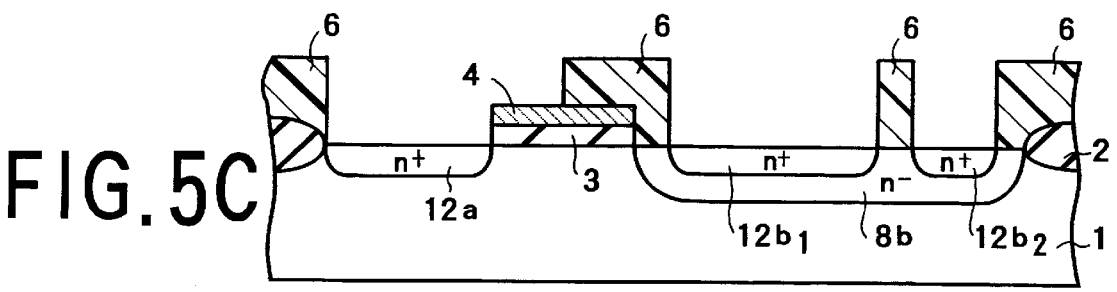

Then, after removing the resist pattern 5, a resist pattern 6 of a photoresist is formed as shown in FIG. 5C. By ion-implanting an impurity using the resist pattern 6 as a mask, n⁺-diffusion layer regions $12a$, $12b_1$, and $12b_2$ are formed (see FIG. 5C). Furthermore, the n⁺-diffusion layer regions $12a$, $12b_1$ and $12b_2$ are formed so that each is shallower than the n⁻-diffusion layer region $8b$ and has a higher impurity concentration than that of the n⁻-diffusion layer region $8b$.

Figure 5D:
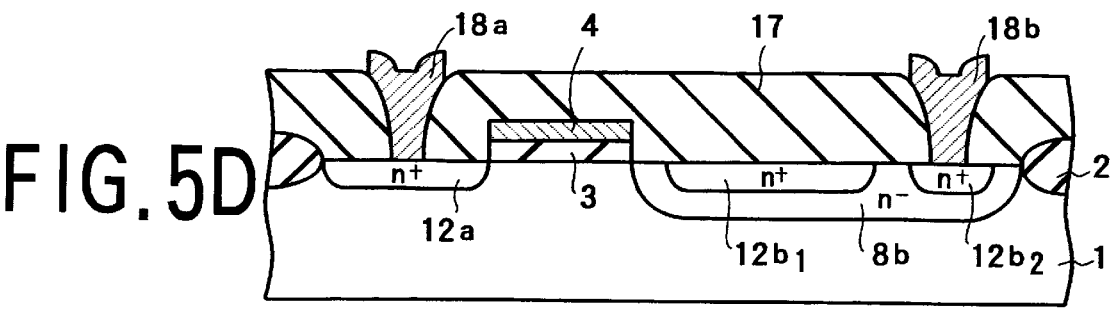

Then, after removing the resist pattern 6, an interlayer insulator film 17 is deposited on the whole surface of the substrate as shown in FIG. 5D, and connecting holes for providing contacts to the n⁺-diffusion layer regions $12a$ and $12b_2$ are formed by the patterning. Thereafter, films of a conductive material are deposited so as to fill in the connecting holes, and source electrode $18a$ and a drain electrode $18b$ are formed by the patterning to complete a MOS transistor.

Figure 6A:
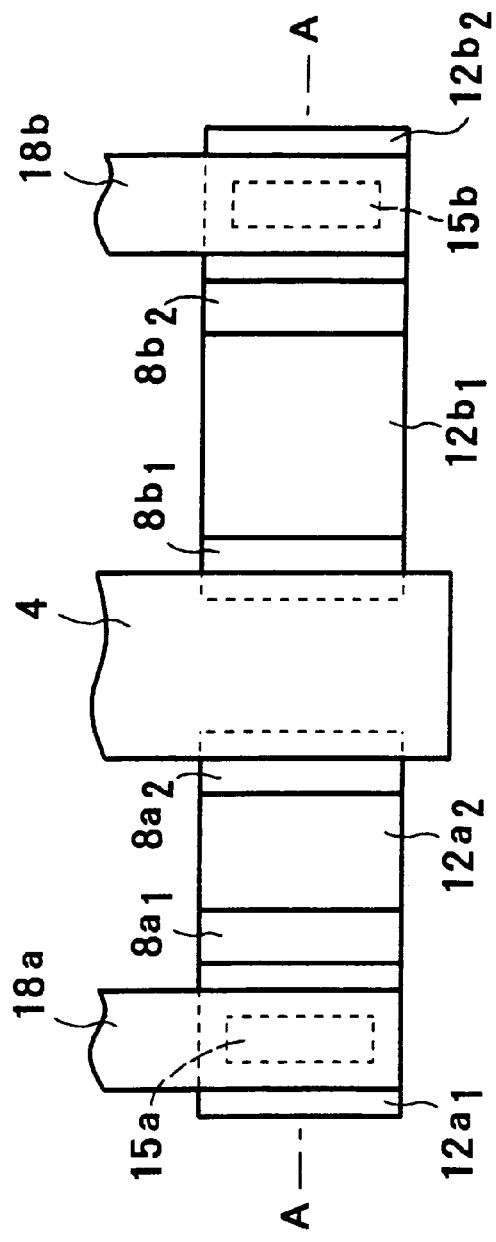
FIG. 6A is a plan view of the sixth preferred embodiment of a semiconductor device according to the present invention.
Figure 6B:
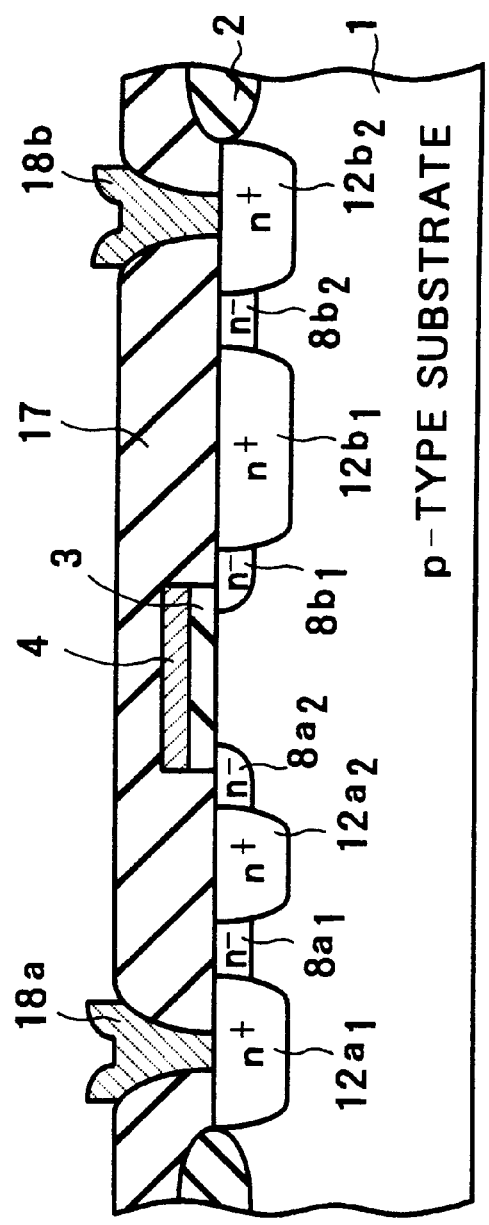
FIG. 6B is a sectional view taken along line A—A of FIG. 6A.

Referring to FIGS. 6A and 6B, the sixth preferred embodiment of a semiconductor device according to the present invention will be described below. FIG. 6A is a plan view of the sixth preferred embodiment of a semiconductor device according to the present invention, and FIG. 6B is a sectional view taken along line A—A of FIG. 6A.

The semiconductor device in the sixth preferred embodiment is formed so that the n⁺-diffusion layer region $12a$ serving as the source region of the semiconductor device in the first preferred embodiment shown in FIGS. 1A and 1B is divided in the n⁻-diffusion layer region similar to the drain side. That is, the n⁺-diffusion layer region $12a$ is divided into two n⁺-diffusion layer regions $12a_1$ and $12a_2$. Between the n⁺-diffusion layer regions $12a_1$ and $12a_2$, an n⁻-diffusion layer region $8a_1$ is provided. Between the n⁺-diffusion layer region $12a_2$ and a channel region arranged directly below a gate electrode 4, an n⁻-diffusion layer region $8a_2$ is provided. The n⁺-diffusion layer region $12a_1$ is electrically connected to a gate electrode $18a$ by means of a contact $15a$.

The semiconductor device in the sixth preferred embodiment has the same advantages as those in the first preferred embodiment since it has the same structure of the drain side as that in the first preferred embodiment.

Moreover, since the source side has the same structure as that of the drain side, i.e., since the n⁺-diffusion layer is divided into two portions at a location neighboring the contact and the divided portions are connected to each other by means of the n⁻-diffusion layer, this device can be used to cope with the ESD even if the drain and source are inverted. For example, this device can be effectively applied to a transmission gate.

Referring to FIGS. 7A and 7B, the seventh preferred embodiment of a semiconductor device according to the present invention will be described below. FIG. 7A is a plan view of the seventh preferred embodiment of a semiconductor device according to the present invention, and FIG. 7B is a sectional view taken along line A—A of FIG. 7A.

The semiconductor device in this seventh preferred embodiment has the same as that in the sixth preferred embodiment, except that an n⁻-diffusion layer region $8b$ is formed so as to surround drain-side n⁺-diffusion layer regions $12b_1$ and $12b_2$ and an n⁻-diffusion layer region $8a$ is formed so as to surround source-side n⁺-diffusion layer regions $12a_1$ and $12a_2$. The semiconductor device in the seventh preferred embodiment has the same advantages as those in the sixth preferred embodiment.

Figure 8A:
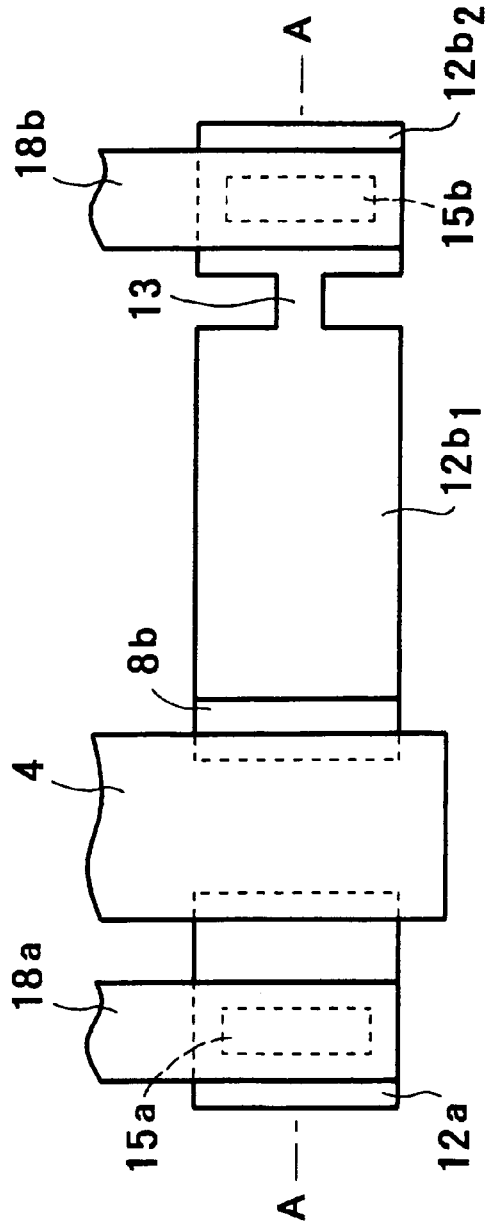
FIG. 8A is a plan view of the eighth preferred embodiment of a semiconductor device according to the present invention.
Figure 8B:
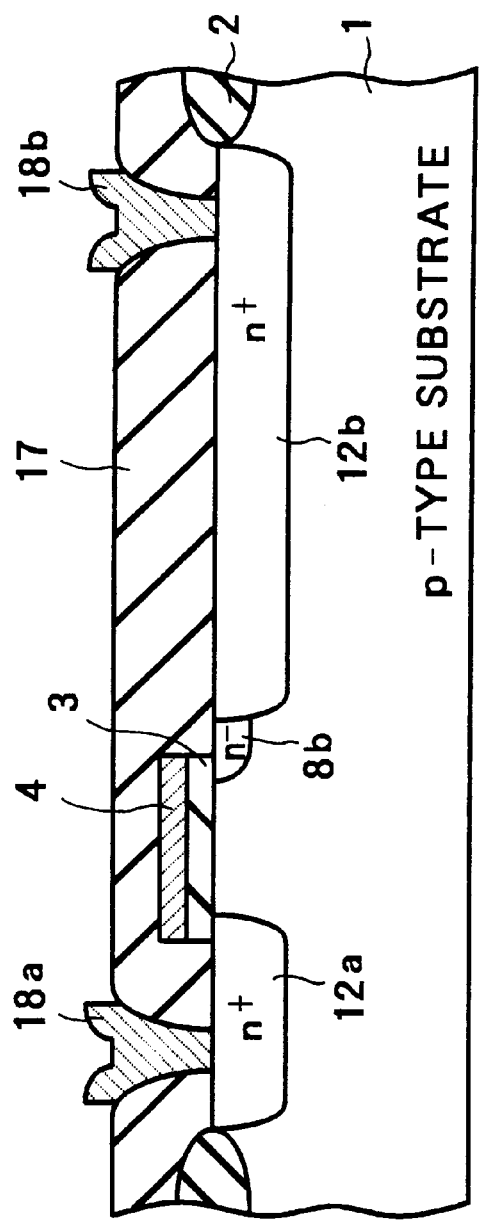
FIG. 8B is a sectional view taken along line A—A of FIG. 8A.

Referring to FIGS. 8A and 8B, the eighth preferred embodiment of a semiconductor device according to the present invention will be described below. FIG. 8A is a plan view of the eighth preferred embodiment of a semiconductor device according to the present invention, and FIG. 8B is a sectional view taken along line A—A of FIG. 8A.

In the eighth preferred embodiment of the semiconductor device, two n⁺-diffusion layer regions $12b_2$ and $12b_2$ serving as drain regions are connected to each other by means of a connecting portion 13 of a narrow n⁺-diffusion region near a contact $15b$ in place of the n⁻-diffusion layer region $8b_2$ of the semiconductor device in the third preferred embodiment shown in FIGS. 3A and 3B. In FIG. 8B, the n⁺-diffusion layer regions $12b_1$ and $12b_2$ connected by the connecting portion 13 are shown as an n⁺-diffusion layer region $12b$.

The connecting portion 13 has a higher value of resistance than that of the n⁺-diffusion layer region $12b$ since it is narrower than the n⁺-diffusion layer region $12b$. Therefore, even if a surge voltage is applied to a drain electrode $18b$, the surge voltage is difficult to pass through the connecting portion 13 to be transmitted to the gate-side n⁺-diffusion layer region $12b_1$, so that it is possible to prevent the surge voltage from passing through the gate-side n⁺-diffusion layer region $12b_1$ to cause the avalanche breakdown. Thus, the semiconductor device in the eighth preferred embodiment has the same advantages as those in the third preferred embodiment.

Referring to FIGS. 9A and 9B, the ninth preferred embodiment of a semiconductor device according to the present invention will be described below. FIG. 9A is a plan view of the ninth preferred embodiment of a semiconductor device according to the present invention, and FIG. 9B is a sectional view taken along line A—A of FIG. 9A.

The semiconductor device in this ninth preferred embodiment has the same construction as that in the eighth preferred embodiment shown in FIGS. 8A and 8b, except that an n⁻-diffusion layer region $8b$ is formed so as to surround an n⁺-diffusion layer region $12b$. The semiconductor device in the ninth preferred embodiment has the same advantages as those in the eighth preferred embodiment.

Referring to FIGS. 10A and 10B, the tenth preferred embodiment of a semiconductor device according to the present invention will be described below. FIG. 10A is a plan view of the tenth preferred embodiment of a semiconductor device according to the present invention, and FIG. 10B is a sectional view taken along line A—A of FIG. 10A.

The semiconductor device in the tenth preferred embodiment has the same construction as that in the eighth preferred embodiment shown in FIGS. 8A and 8B, except that an n⁻-diffusion layer region $8a$ is provided between a source region $12a$ and a channel region arranged directly below a gate electrode 4 and that the source region $12a$ is formed by two n⁺-diffusion layer regions $12a_1$ and $12a_2$ which are spaced from and connected to each other by means of a connecting portion $13a$ of a narrow n⁺-diffusion layer region similar to the drain side. In FIG. 10B, the n⁺-diffusion layer regions $12a_1$ and $12a_2$ connected by the connecting portion $13a$ are shown as an n⁺-diffusion layer region $12a$. In FIG. 10A, reference number $13b$ is used for the drain-side connecting portion. Since the semiconductor device in the tenth preferred embodiment has the same drain-side structure as that in the eighth preferred embodiment, it has the same advantages as those in the eighth preferred embodiment.

Figure 11A:
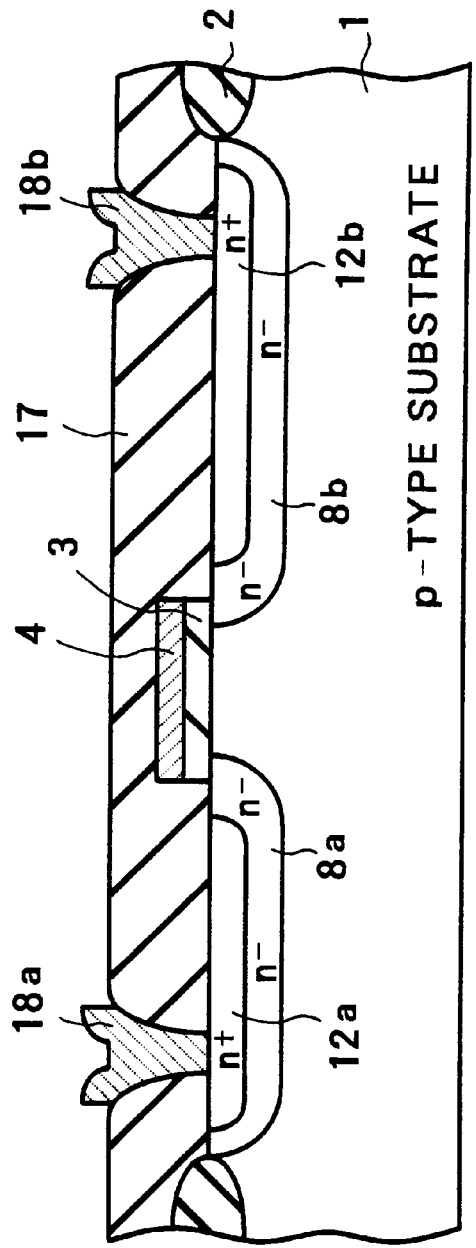
FIG. 11A is a plan view of the eleventh preferred embodiment of a semiconductor device according to the present invention.
Figure 12A:
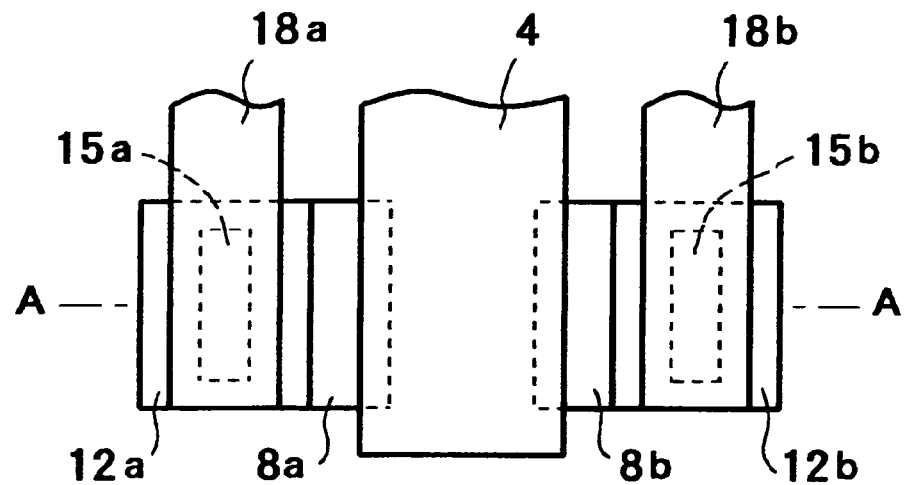
FIG. 12A is a plan view of a conventional semiconductor device.
Figure 12B:
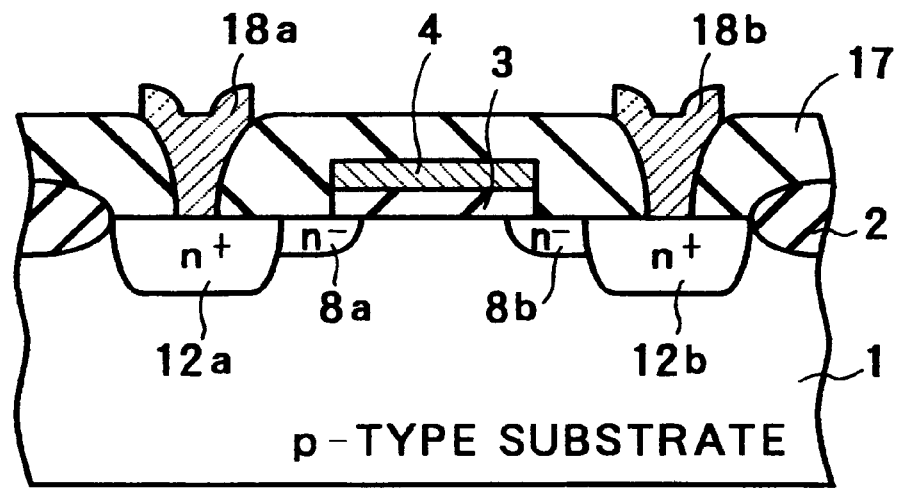
FIG. 12B is a sectional view taken along line A—A of FIG. 12A.
Figure 13A:
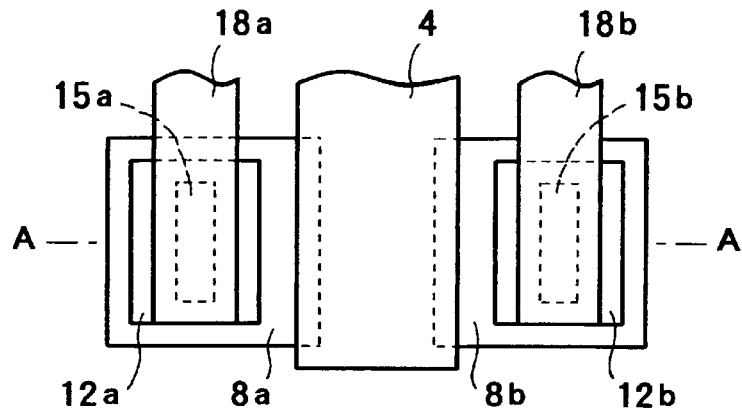
FIG. 13A is a plan view of another conventional semiconductor device.
Figure 13B:
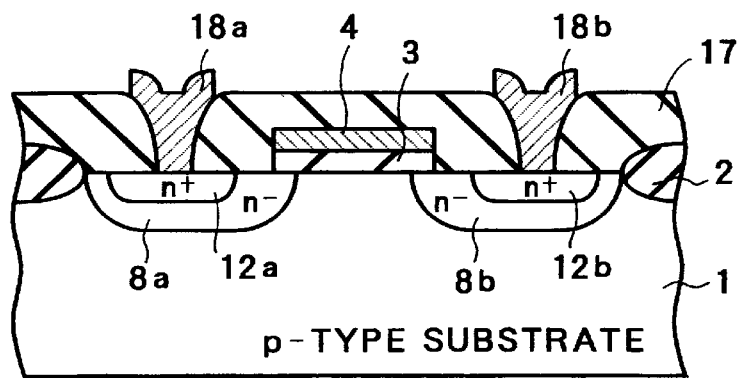
FIG. 13B is a sectional view taken along line A—A of FIG. 13A.
Figure 14:
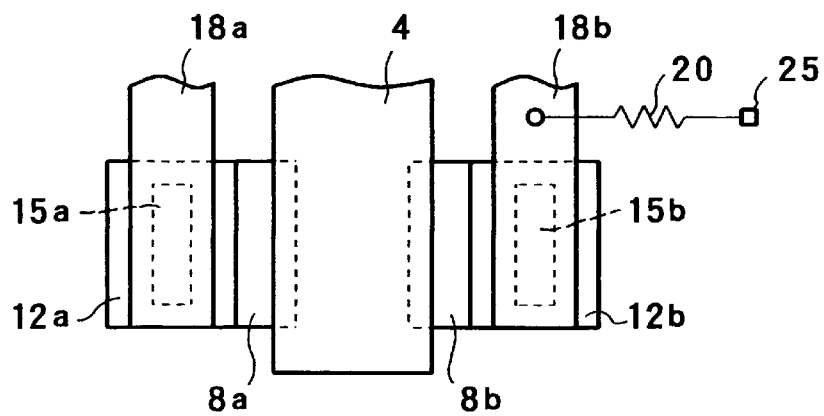
FIG. 14 is a plan view of a conventional semiconductor device.
Figures 15A, 15B:
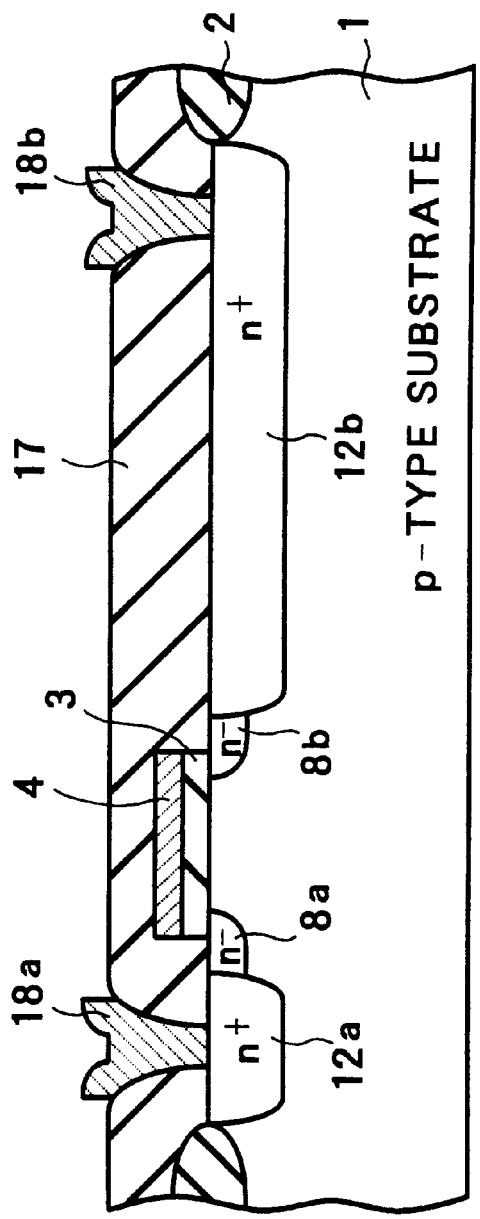
FIG. 15A is a plan view of a conventional semiconductor device.
FIG. 15B is a sectional view taken along line A—A of FIG. 15A.
Figure 16A:
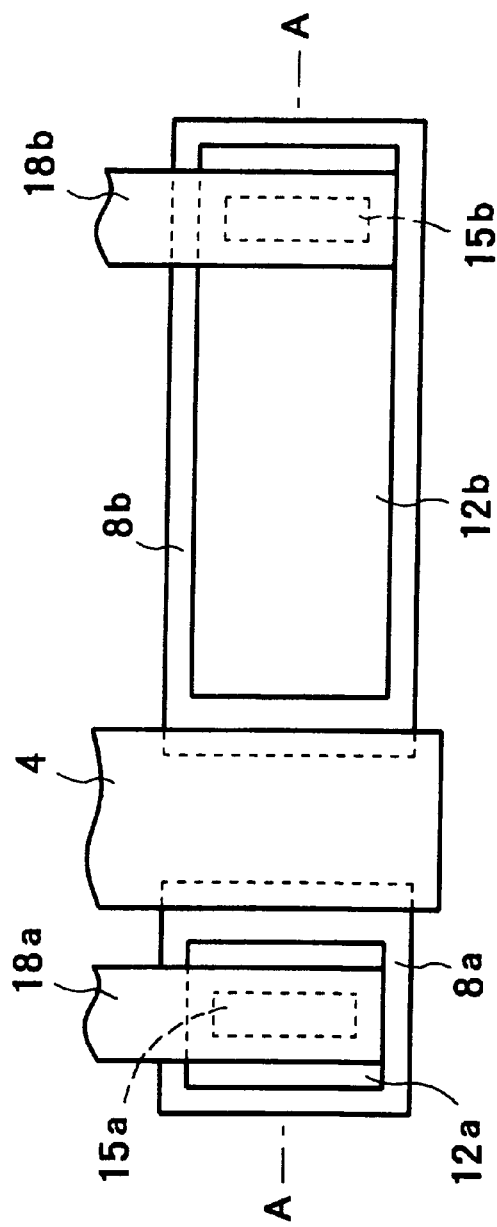
FIG. 16A is a plan view of a conventional semiconductor device.
Figure 16B:
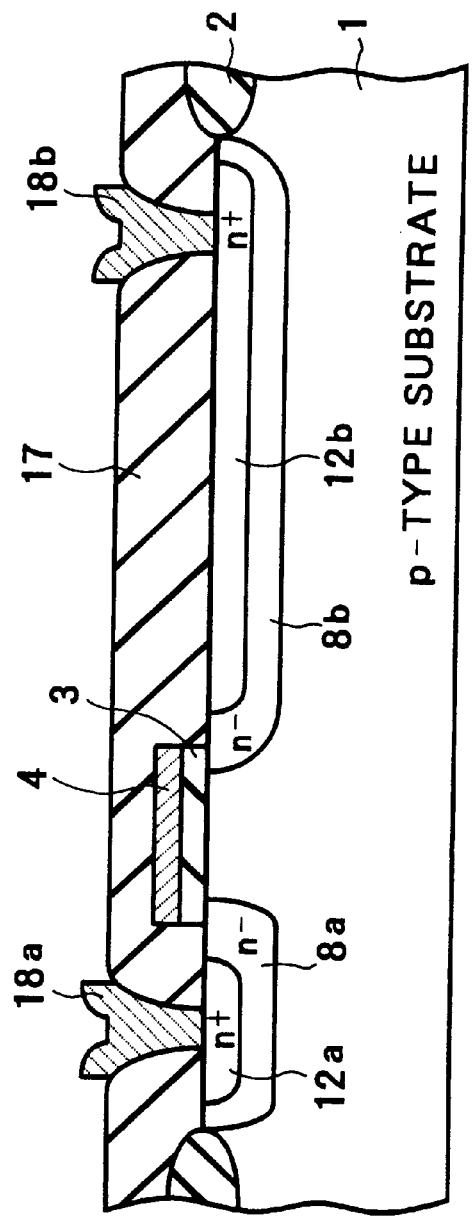
FIG. 16B is a sectional view taken along line A—A of FIG. 16A.

Referring to FIGS. 11A and 11B, the eleventh preferred embodiment of a semiconductor device according to the present invention will be described below. FIG. 11A is a plan view of the eleventh preferred embodiment of a semiconductor device according to the present invention, and FIG. 11B is a sectional view taken along line A—A of FIG. 11A.

The semiconductor device in the eleventh preferred embodiment has the same construction as that in the tenth preferred embodiment shown in FIGS. 10A and 10B, except that a drain-side n⁻-diffusion layer region $8a$ is formed so as to surround an n⁻-diffusion layer region $12b$ and that a source-side n⁻-diffusion layer region $8a$ is formed so as to surround an n⁺-diffusion layer region $12a$. The semiconductor device in the eleventh preferred embodiment has the same advantages as those in the tenth preferred embodiment.

As can be seen from the fifth preferred embodiment of a process for producing a semiconductor device according to the present invention, it is possible to provide the structure of the present invention without particularly increasing the number of steps if the process for producing a MOS transistor having the LDD structure by the mask LDD is utilized. This is not applied only to the fourth preferred embodiment of a semiconductor device according to the present invention, but it is also applied to the other preferred embodiments of a semiconductor device according to the present invention.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

For example, while the nMOS transistor has been described in the above preferred embodiments, a pMOS transistor may be applied to the present invention. In addition, while the n⁻-diffusion layers has been had the same length as shown in FIGS. 1A through 11B, the respective n⁻-diffusion layers may have different lengths.

As described above, according to the semiconductor device of the present invention, it is possible to prevent the element characteristics from deteriorating even if a surge voltage is applied and to decrease the element size.

What is claimed is:

1. A semiconductor device comprising:
   a semiconductor substrate of a first conductive type;
   a gate electrode formed above said semiconductor substrate;
   a first semiconductor region of a second conductive type, said first semiconductor region being formed on said semiconductor substrate in one of both side regions of said gate electrode so as to be adjacent to said gate electrode;
   a second semiconductor region of the second conductive type formed on said semiconductor substrate in the other region of said both side regions of said gate electrode so as to be adjacent to said gate electrode;
   a third semiconductor region of the second conductive type formed in said one of both side regions so as to be isolated from said first semiconductor region and to be spaced from said second semiconductor region by a greater distance than that between said first and second semiconductor regions;
   a connecting portion for connecting said first semiconductor region to said third semiconductor region, said connecting portion having a higher resistance than those of said first and third semiconductor regions;
   a first electrode formed so as to be electrically connected to said third semiconductor region; and
   a second electrode formed so as to be electrically connected to said second semiconductor region,
   wherein said connecting portion is formed so that a distance between said connecting portion and said first electrode is less than that between said connecting portion and said gate electrode.

2. A semiconductor device as set forth in claim 1, wherein said connecting portion is made of a diffusion layer region, which has the second conductive type and substantially the same impurity concentration as those of said first and third semiconductor regions, said connecting portion having a smaller width than those of said first and third semiconductor regions.

3. A semiconductor device as set forth in claim 2, wherein said first and third semiconductor regions and said connecting portion are surrounded by a diffusion layer region of the second conductive type, which is formed on said semiconductor substrate and which has a lower impurity concentration than those of said first and third semiconductor regions.

4. A semiconductor device as set forth in claim 2, which further comprises a diffusion layer region of the second conductive type which is formed between a region of said semiconductor substrate serving as a channel arranged directly below said gate electrode and said first semiconductor region and which has a lower impurity concentration than those of said first and third semiconductor regions.

5. A semiconductor device as set forth in claim 1, wherein said connecting portion is a diffusion layer region of the second conductive type having a lower impurity concentration than those of said first and third semiconductor regions.

6. A semiconductor device as set forth in claim 5, which further comprises a diffusion layer region of the second conductive type which is formed between a region of said semiconductor substrate serving as a channel arranged directly below said gate electrode and said first semiconductor region and which has a lower impurity concentration than those of said first and third semiconductor regions.

7. A semiconductor device as set forth in claim 6, wherein said connecting portion has substantially the same impurity concentration as that of said diffusion layer region of the second conductive type formed between said channel and said first semiconductor region.

8. A semiconductor device as set forth in claim 5, wherein said diffusion layer region forming said connecting portion surrounds said first and third semiconductor regions.

9. A semiconductor device as set forth in claim 1, wherein said connecting portion is formed adjacent to said first electrode between said gate electrode and said first electrode.

10. A semiconductor device as set forth in claim 1, which further comprises a diffusion layer region of the second conductive type which is formed between a region of said semiconductor substrate serving as a channel arranged directly below said gate electrode and said first semiconductor region and which has a lower impurity concentration than those of said first and third semiconductor regions.

11. A semiconductor device comprising:
    a semiconductor substrate of a first conductive type;
    a gate electrode formed above said semiconductor substrate;
    a first drain region of a second conductive type, said first drain region being formed on said semiconductor substrate in one of both side regions of said gate electrode so as to be adjacent to said gate electrode;
    a first source region of the second conductive type formed on said semiconductor substrate in the other region of said both side regions of said gate electrode so as to be adjacent to said gate electrode;
    a second drain region of the second conductive type formed in said one of both side regions so as to be isolated from said first drain region and to be spaced from said first source region by a greater distance than that between said first drain region and said first source region;
    a second source region of the second conductive type formed in said other region so as to be isolated from said first source region and to be spaced from said first drain region by a greater distance than that between said first drain region and said first source region;
    a first connecting portion for connecting said first drain region to said second drain region, said connecting portion having a higher resistance than those of said first and second drain regions;
    a second connecting portion for connecting said first source region to said second source region, said connecting portion having a higher resistance than those of said first and second source regions;
    a drain electrode formed so as to be electrically connected to said second drain region; and
    a source electrode formed so as to be electrically connected to said second source region.

12. A semiconductor device as set forth in claim 11, wherein said first connecting portion is made of a diffusion layer region, which has the second conductive type and substantially the same impurity concentration as those of said first and second drain regions, said first connecting portion having a smaller width than those of said first and second drain regions, and wherein said second connecting portion is made of a diffusion layer region, which has the second conductive type and substantially the same impurity concentration as those of said first and second source regions, said second connecting portion having a smaller width than those of said first and second source regions.

13. A semiconductor device as set forth in claim 12, which further comprises a diffusion layer region of the second conductive type which is formed between a region of said semiconductor substrate serving as a channel arranged directly below said gate electrode and said first drain region and which has a lower impurity concentration than those of said first and second drain regions, and a diffusion layer region of the second conductive type which is formed between said channel and said first source region and which has a lower impurity concentration than those of said first and second source regions.

14. A semiconductor device as set forth in claim 11, wherein said first connecting portion is a diffusion layer region of the second conductive type having a lower impurity concentration than those of said first and second drain regions, and said second connecting portion is a diffusion layer region of the second conductive type having a lower impurity concentration than those of said first and second source regions.

15. A semiconductor device as set forth in claim 14, which further comprises a diffusion layer region of the second conductive type which is formed between a region of said semiconductor substrate serving as a channel arranged directly below said gate electrode and said first drain region and which has a lower impurity concentration than those of said first and second drain regions, and a diffusion layer region of the second conductive type which is formed between said channel and said first source region and which has a lower impurity concentration than those of said first and second source regions.

16. A semiconductor device as set forth in claim 15, wherein said first connecting portion has substantially the same impurity concentration as that of said diffusion layer region of the second conductive type formed between said channel and said first drain region, and said second connecting portion has substantially the same impurity concentration as that of said diffusion layer region of the second conductive type formed between said channel and said first source region.

17. A semiconductor device as set forth in claim 14, wherein said diffusion layer region forming said first connecting portion surrounds said first and second drain regions.

18. A semiconductor device as set forth in claim 14, wherein said diffusion layer region forming said second connecting portion surrounds said first and second source regions.

19. A semiconductor device as set forth in claim 11, wherein said first connecting portion is formed adjacent to said drain electrode between said gate electrode and said drain electrode, and said second connecting portion is formed adjacent to said source electrode between said gate electrode and said source electrode.

20. A semiconductor device as set forth in claim 19, which further comprises a diffusion layer region of the second conductive type which is formed between a region of said semiconductor substrate serving as a channel arranged directly below said gate electrode and said first drain region and which has a lower impurity concentration than those of said first and second drain regions, and a diffusion layer region of the second conductive type which is formed between said channel and said first source region and which has a lower impurity concentration than those of said first and second source regions.

* * * * *